United States Patent
Kim et al.

(10) Patent No.: US 11,526,732 B2
(45) Date of Patent: Dec. 13, 2022

(54) APPARATUS AND METHOD FOR STATISTICAL MEMORY NETWORK

(71) Applicant: Electronics and Telecommunications Research Institute, Daejeon (KR)

(72) Inventors: Hyun Woo Kim, Daejeon (KR); Ho Young Jung, Daejeon (KR); Jeon Gue Park, Daejeon (KR); Yun Keun Lee, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 990 days.

(21) Appl. No.: 16/260,637

(22) Filed: Jan. 29, 2019

(65) Prior Publication Data

US 2019/0318228 A1    Oct. 17, 2019

(30) Foreign Application Priority Data

Apr. 11, 2018 (KR) .......................... 10-2018-0042191

(51) Int. Cl.
  *G06N 3/04*   (2006.01)
  *G06F 3/06*   (2006.01)
  *G06N 3/08*   (2006.01)
  *H03H 17/02*  (2006.01)

(52) U.S. Cl.
  CPC ......... *G06N 3/0472* (2013.01); *G06F 3/0604* (2013.01); *G06F 3/0659* (2013.01); *G06F 3/0673* (2013.01); *G06N 3/0445* (2013.01); *G06N 3/08* (2013.01); *H03H 17/0257* (2013.01)

(58) Field of Classification Search
  CPC .... G06F 3/0604; G06F 3/0659; G06F 3/0673; H03H 17/0257; G06N 3/0445; G06N 3/0472; G06N 3/08
  See application file for complete search history.

(56) References Cited

U.S. PATENT DOCUMENTS

| | | | |
|---|---|---|---|
| 2016/0275964 A1* | 9/2016 | Kim | ..................... G10L 15/20 |
| 2017/0103324 A1 | 4/2017 | Weston et al. | |
| 2017/0200077 A1 | 7/2017 | Weston et al. | |

OTHER PUBLICATIONS

Alex Graves et al.; "Neural Turing Machines"; arXiv: 1410.5401v2 [cs.NE] Dec. 10, 2014; pp. 1-26.

* cited by examiner

*Primary Examiner* — Yong J Choe
(74) *Attorney, Agent, or Firm* — Kile Park Reed & Houtteman PLLC

(57) ABSTRACT

Provided are an apparatus and method for a statistical memory network. The apparatus includes a stochastic memory, an uncertainty estimator configured to estimate uncertainty information of external input signals from the input signals and provide the uncertainty information of the input signals, a writing controller configured to generate parameters for writing in the stochastic memory using the external input signals and the uncertainty information and generate additional statistics by converting statistics of the external input signals, a writing probability calculator configured to calculate a probability of a writing position of the stochastic memory using the parameters for writing, and a statistic updater configured to update stochastic values composed of an average and a variance of signals in the stochastic memory using the probability of a writing position, the parameters for writing, and the additional statistics.

16 Claims, 5 Drawing Sheets

APPARATUS AND METHOD FOR STATISTICAL MEMORY NETWORK

CROSS-REFERENCE TO RELATED APPLICATION

This application claims priority to and the benefit of Korean Patent Application No. 10-2018-0042191, filed on Apr. 11, 2018, the disclosure of which is incorporated herein by reference in its entirety.

BACKGROUND

1. Field of the Invention

The present invention relates to a memory network and, more particularly, to an apparatus and method for a statistical memory network, the apparatus and method making it possible to apply a speech signal and a video signal including noise in a memory network.

2. Discussion of Related Art

In general, deep learning is a machine learning algorithm for attempting high-level abstraction of data using input and output layers which are similar to neurons of a brain.

Typical deep learning methods include a deep neural network, a convolutional neural network, a recurrent neural network, a restricted Boltzmann machine, and the like. The deep learning methods are applied to the fields of computer vision, speech recognition, natural language processing, handwriting recognition, signal processing, etc. and are showing excellent results.

Among the deep learning methods, a recurrent neural network uses a memory therein to process any input, unlike a feedforward neural network.

As a structure of a recurrent neural network, long short-term memory (LSTM) units are most widely being used.

Recently, research is being conducted on a memory network for improving performance of a neural network by processing logic flow control and external memory explicitly separately, like a computing model having the Von Neumann architecture.

A neural turing machine, an end-to-end memory network, etc. have been proposed, and an expected achievement has been made in a text understanding field.

Such an existing memory network is configured as a neural network and includes, as shown in FIG. 1, a controller 10 which provides parameters for determining memory positions for reading and writing and values to be read and written from input signals and calculates an output signal using a value read from the memory, a writer 11 which calculates a weight of a memory position for reading with a cosine similarity using the parameters provided by the controller 10 and determines a memory value to be read by linearly combining memories via the weight of the memory position, and a reader 13 which receives the parameters from the controller 10 to delete or add information stored in the memory, calculates a weight of a memory position for writing with a cosine similarity, and acquires a new memory 20 by deleting or adding information of the memory according to the weight of the memory position for writing.

However, in the existing memory network, a value stored in an external memory for use is required to be deterministic. For this reason, there are limitations in processing stochastic values such as speech and video signals contaminated with noise.

Therefore, the existing memory network does not have a method for processing uncertainty information of speech and video signals contaminated with noise according to variance of the noise.

SUMMARY OF THE INVENTION

The present invention is directed to providing an apparatus and method for a statistical memory network, the apparatus and method estimating uncertainty information of input signals, generating parameters through deep learning to determine probabilistic memory positions for reading and writing, and storing and using stochastic values in a memory.

Objectives of the present invention are not limited to those mentioned above, and other objects which have not been mentioned above may be clearly understood by those of ordinary skill in the art from the following description.

According to an aspect of the present invention, there is provided an apparatus for a statistical memory network, the apparatus including: a stochastic memory; an uncertainty estimator configured to estimate uncertainty information of external input signals from the input signals and provide the uncertainty information of the input signals; a writing controller configured to generate parameters for writing in the stochastic memory using the external input signals and the uncertainty information and generate additional statistics by converting statistics of the external input signals; a writing probability calculator configured to calculate a probability of a writing position of the stochastic memory using the parameters for writing; and a statistic updater configured to update stochastic values of signals stored at a position of the stochastic memory corresponding to the probability of a writing position with an average and a variance of the additional statistics.

The apparatus may further include: a reading controller configured to generate parameters for reading the stochastic memory using the external input signals and the uncertainty information provided by the uncertainty estimator; a reading probability calculator configured to calculate a probability of a reading position of the stochastic memory using the parameters for reading provided by the reading controller; and a reading statistic determiner configured to acquire stochastic values composed of an average and a variance of signals stored at a position of the stochastic memory corresponding to the calculated probability of a reading position.

The reading controller may generate an external output signal using the stochastic values acquired by the reading statistic determiner.

Here, the uncertainty estimator may use a Kalman filter, and the uncertainty information of the external input signals may be an average and a variance of noise.

Meanwhile, the writing controller may use a neural network configured by stacking multiple layers of recurrent neural networks having a long short-term memory (LSTM) structure and then causing a linear transformation in a final layer.

Meanwhile, the reading controller may generate the parameters for reading using a neural network configured by stacking multiple layers of recurrent neural networks having an LSTM structure and then causing a linear transformation in a final layer and may generate an external output signal using a neural network configured by stacking multiple layers of feedforward neural networks and then causing a linear transformation in a final layer.

The writing probability calculator employed in an exemplary embodiment of the present invention may calculate a ratio of a normal distribution probability at a stochastic memory position as the probability of a writing position using an average and a covariance of the stochastic memory and an average key and a covariance key of the parameters for writing.

Meanwhile, the statistic updater may acquire an updated average of the stochastic memory by deleting an existing average of the stochastic memory at a ratio of a product of a deletion weight of the parameters for writing and a deletion constant of the parameters for writing and adding a product of the average of the additional statistics and the probability of a writing position, delete an existing variance of the stochastic memory as much as a ratio of a product of a square of a difference between the deletion weight of the parameters for writing and the existing average of the stochastic memory and the deletion constant of the parameters for writing, and acquire an updated variance of the stochastic memory by adding a product of the probability of a writing position and a sum of a square of a difference between the average of the additional statistics and the existing average of the stochastic memory and the variance of the additional statistics.

The reading probability calculator may calculate a ratio of a normal distribution probability at a stochastic memory position as the probability of a reading position using an average and a covariance of the stochastic memory and an average key and a covariance key of the parameters for reading.

The reading statistic determiner may use an average of reading stochastic values, which is an expected value obtained by linearly combining an average key of the parameters for reading and an average of the stochastic memory according to a ratio of a reciprocal of a covariance key of the parameters for reading to a reciprocal of a covariance of the stochastic memory, and a covariance of the reading stochastic values, which is an expected value of an harmonic average of the covariance key of the parameters for reading and the covariance of the stochastic memory.

According to another aspect of the present invention, there is provided a method for a statistical memory network, the method including: estimating, by an uncertainty estimator, uncertainty information of external input signals from the input signals and providing the uncertainty information of the input signals; generating, by a writing controller, parameters for writing in a stochastic memory using the external input signals and the uncertainty information and generating additional statistics by converting statistics of the external input signals; calculating, by a writing probability calculator, a probability of a writing position of the stochastic memory using the parameters for writing; and updating, by a statistic updater, stochastic values of signals stored at a position of the stochastic memory corresponding to the probability of a writing position with an average and a variance of the additional statistics.

The method may further include: generating, by a reading controller, parameters for reading the stochastic memory using the external input signals and the uncertainty information provided by the uncertainty estimator; calculating, by a reading probability calculator, a probability of a reading position of the stochastic memory using the parameters for reading provided by the reading controller; acquiring, by a reading statistic determiner, stochastic values composed of an average and a variance of signals stored at a position of the stochastic memory corresponding to the calculated probability of a reading position; and generating, by the reading controller, an external output signal using the stochastic values acquired by the reading statistic determiner.

Here, the estimating of the uncertainty information may include using a Kalman filter, and the uncertainty information of the external input signals may be an average and a variance of noise.

The generating of the external output signal according to an exemplary embodiment of the present invention may include using a neural network configured by stacking multiple layers of recurrent neural networks having an LSTM structure and then causing a linear transformation in a final layer.

Meanwhile, the generating of the parameters for reading may include generating the parameters for reading using a neural network configured by stacking multiple layers of recurrent neural networks having an LSTM structure and then causing a linear transformation in a final layer, and the generating of the external output signal may include generating the external output signal using a neural network configured by stacking multiple layers of feedforward neural networks and then causing a linear transformation in a final layer.

The calculating of the probability of a writing position of the stochastic memory may include calculating a ratio of a normal distribution probability at a stochastic memory position as the probability of a writing position using an average and a covariance of the stochastic memory and an average key and a covariance key of the parameters for writing.

The updating of the stochastic values of signals stored at the position of the stochastic memory may include acquiring an updated average of the stochastic memory by deleting an existing average of the stochastic memory at a ratio of a product of a deletion weight of the parameters for writing and a deletion constant of the parameters for writing and adding a product of the average of the additional statistics and the probability of a writing position, include deleting an existing variance of the stochastic memory as much as a ratio of a product of a square of a difference between the deletion weight of the parameters for writing and the existing average of the stochastic memory and the deletion constant of the parameters for writing, and include acquiring an updated variance of the stochastic memory by adding a product of the probability of a writing position and a sum of a square of a difference between the average of the additional statistics and the existing average of the stochastic memory and the variance of the additional statistics.

Meanwhile, the calculating of the probability of the reading position of the stochastic memory may include calculating a ratio of a normal distribution probability at a stochastic memory position as the probability of a reading position using an average and a covariance of the stochastic memory and an average key and a covariance key of the parameters for reading.

The generating of the external output signal may include using an average of reading stochastic values, which is an expected value obtained by linearly combining an average key of the parameters for reading and an average of the stochastic memory according to a ratio of a reciprocal of a covariance key of the parameters for reading to a reciprocal of a covariance of the stochastic memory, and a covariance of the reading stochastic values, which is an expected value of an harmonic average of the covariance key of the parameters for reading and the covariance of the stochastic memory.

BRIEF DESCRIPTION OF THE DRAWINGS

The above and other objects, features and advantages of the present invention will become more apparent to those of ordinary skill in the art by describing exemplary embodiments thereof in detail with reference to the accompanying drawings, in which.

DETAILED DESCRIPTION OF EXEMPLARY EMBODIMENTS

Advantages and features of the present invention and methods for achieving them will be apparent from exemplary embodiments described in detail below in conjunction with the accompanying drawings. However, the present invention is not limited to the embodiments set forth herein and will be implemented in many different forms, and these embodiments are only provided to make the disclosure of the present invention complete and help those or ordinary skill in the technical field to which the present invention pertains to fully understand the scope of the invention. The present invention is only defined by the scope of the appended claims. The terminology used herein is for the purpose of describing the embodiments and is not intended to be limiting of the present invention. As used herein, the singular forms are intended to include the plural forms as well, unless the context clearly indicates otherwise. The terms "comprises" and/or "comprising" when used herein specify the presence of stated components, steps, operations, and/or elements but do not preclude the presence or addition of one or more other components, steps, operations, and/or elements.

Figure 1:
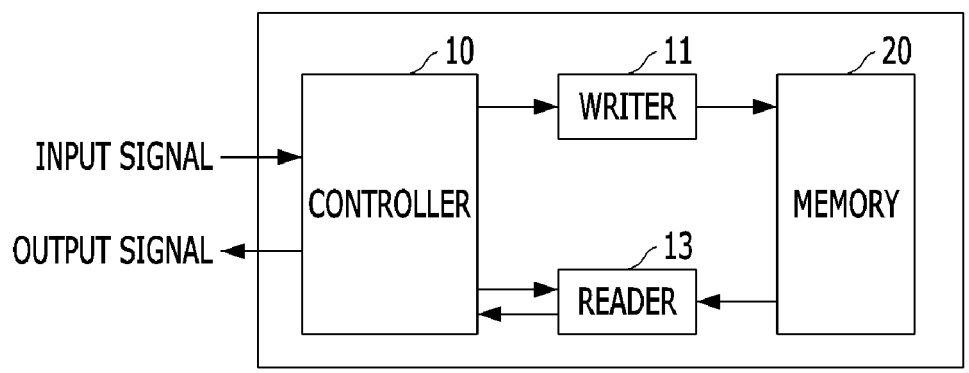
FIG. 1 is a functional block diagram illustrating an existing apparatus for a memory network.
Figure 2:
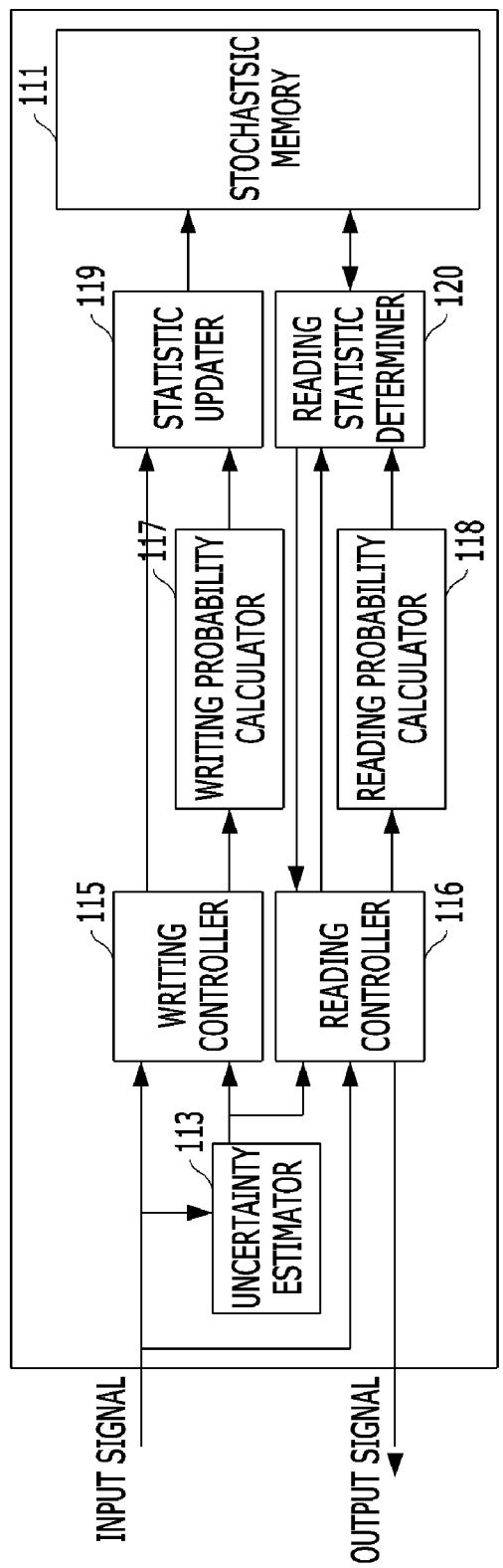
FIG. 2 is a functional block diagram illustrating an apparatus for a statistical memory network according to an exemplary embodiment of the present invention.

Hereinafter, the exemplary embodiments of the present invention will be described in detail with reference to the accompanying drawings. FIG. 2 is a functional block diagram illustrating an apparatus for a statistical memory network according to an exemplary embodiment of the present invention. As shown in FIG. 2, the apparatus for a statistical memory network according to an exemplary embodiment of the present invention includes a stochastic memory 111, an uncertainty estimator 113, a writing controller 115, a writing probability calculator 117, and a statistic updater 119.

The stochastic memory 111 stores an average and a covariance of additional statistics obtained by converting an average and a covariance of input signals through the writing controller 115.

The uncertainty estimator 113 serves to estimate uncertainty information of the input signals from the external input signals and provides the uncertainty information of the input signals to the writing controller 115. Here, the uncertainty estimator 113 estimates an average and a variance of noise through a Kalman filter and provides the uncertainty information of the input signals to the writing controller 115.

Here, the uncertainty information of the external input signals may be an average and a variance of noise.

The writing controller 115 serves to generate parameters for writing in the stochastic memory 111 using the external input signals and the uncertainty information provided by the uncertainty estimator 113 and generate additional statistics by converting statistics of the external input signals.

The writing probability calculator 117 serves to calculate a probability of a writing position of the stochastic memory 111 using the parameters for writing generated by the writing controller 115.

The statistic updater 119 serves to update stochastic values of signals stored at a position of the stochastic memory 111 corresponding to the probability of a writing position with additional stochastic values generated by converting the average and the covariance of the input signals. In an exemplary embodiment of the present invention, the writing position of the stochastic memory 111 is a position set by checking a position of the stochastic memory 111 to be updated through the probability of a writing position of the stochastic memory 111 calculated by the writing probability calculator 117 and comparing additional stochastic values with stochastic values of signals previously stored in the stochastic memory 111.

Thereafter, the statistic updater 119 replaces or updates the stochastic values of signals previously stored in the stochastic memory 111 with the additional stochastic values.

According to such an exemplary embodiment of the present invention, an apparatus for a memory network capable of processing stochastic characteristics of signals including noise is provided. Therefore, it is possible to store and manage stochastic signals, such as speech and video signals contaminated with noise, in the stochastic memory 111.

An exemplary embodiment of the present invention may further include a reading controller 116, a reading probability calculator 118 and a reading statistic determiner 120.

The reading controller 116 serves to generate parameters for reading the stochastic memory 111 using the external input signals and the uncertainty information provided by the uncertainty estimator 113.

The reading probability calculator 118 serves to calculate a probability of a reading position of the stochastic memory 111 using the parameters for reading provided by the reading controller 116.

The reading statistic determiner 120 serves to acquire stochastic values composed of an average and a variance of signals stored at a position of the stochastic memory 111 corresponding to the calculated probability of a reading position.

Therefore, the reading controller 116 may generate an external output signal using the stochastic values acquired by the reading statistic determiner 120 and output the external output signal.

According to such an exemplary embodiment of the present invention, it is possible to process and output stochastic signals, such as speech and video signals contaminated with noise, in the stochastic memory 111 in which stochastic characteristics of signals are stored.

The writing controller 115 employed in an exemplary embodiment of the present invention may use a neural network configured by stacking multiple layers of recurrent neural networks having a long short-term memory (LSTM) structure and then causing a linear transformation in a final layer.

Meanwhile, the reading controller 116 may generate the parameters for reading using a neural network configured by stacking multiple layers of recurrent neural networks having an LSTM structure and then causing a linear transformation in a final layer and may generate the external output signal using a neural network configured by stacking multiple layers of feedforward neural networks and then causing a linear transformation in a final layer.

Meanwhile, the writing probability calculator 117 employed in an exemplary embodiment of the present invention calculates a ratio of a normal distribution probability at a position of the stochastic memory 111 as the probability of a writing position using an average and a covariance of the stochastic memory 111, and an average key and a covariance key of the parameters for writing as shown in Equation 1 below.

Since the writing probability calculator 117 calculates the probability of a writing position of the stochastic memory 111 as described above, it is possible to store or manage speech and video signals including noise in the stochastic memory 111.

$$p_w(i) = \frac{\mathcal{N}(k_w^\mu; \mu(i), (\sum(i) + k_w^\Sigma))}{\sum_{j=1}^{M} \mathcal{N}(k_w^\mu; \mu(j), (\sum(j) + k_w^\Sigma))} \qquad [\text{Equation 1}]$$

Here, $p_w$ is a probability of writing, $N(x;m,V)$ is a normal distribution function having an average of m and a covariance of V, $\mu$ is an average of a stochastic memory, $\Sigma$ is a covariance of the stochastic memory, $k_w^\mu$ is an average key of parameters for writing, and $k_w^\Sigma$ is a covariance key of the parameters for writing.

The statistic updater 119 employed in an exemplary embodiment of the present invention deletes an existing average of the stochastic memory 111 at a ratio of the product of a deletion weight of the parameters for writing and a deletion constant of the parameters for writing as shown in Equation 2 below.

Also, the statistic updater 119 acquires an updated average of the stochastic memory 111 by adding the product of the average of the additional statistics and the probability of a writing position.

Thereafter, the statistic updater 119 deletes an existing variance of the stochastic memory 111 as much as a ratio of the product of the square of a difference between the deletion weight of the parameters for writing and the existing average of the stochastic memory 111 and the deletion constant of the parameters for writing.

Subsequently, the statistic updater 119 acquires an updated variance of the stochastic memory 111 by adding the product of the probability of a writing position and the sum of the square of a difference between the average of the additional statistics and the existing average of the stochastic memory 111 and the variance of the additional statistics.

$$\mu_{new}(i) = \mu(i)(1-\rho(i)n) + p_w(i)v_\mu$$

$$\Sigma_{new}(i) = (1-\rho(i)(e-\mu(i))^T(e-\mu(i)))\Sigma(i) + p_w(v_E + (v_\mu - \mu(i))^T(v_\mu - \mu(i))) \qquad [\text{Equation 2}]$$

Here, $\mu$ is an average of a stochastic memory, $\Sigma$ is a covariance of the stochastic memory, e is a deletion weight of parameters for writing, $\rho$ is a deletion constant of the parameters for writing, $v_\mu$ is an average of additional statistics, and $v_\Sigma$ is a variance of the additional statistics.

The reading probability calculator 118 employed in an exemplary embodiment of the present invention calculates a ratio of a normal distribution probability at a position of the stochastic memory 111 as the probability of a reading position using the average and the covariance of the stochastic memory 111, and an average key and a covariance key of the parameters for reading as shown in Equation 3 below.

Therefore, the reading probability calculator 118 employed in an exemplary embodiment of the present invention detects positions of stochastic values of signals composed of an average and a variance in the stochastic memory 111 so that information for processing an output signal corresponding to an input signal including noise may be read from the stochastic memory 111.

$$p_r(i) = \frac{\mathcal{N}(k_r^\mu; \mu(i), (\sum(i) + k_r^\Sigma))}{\sum_{j=1}^{M} \mathcal{N}(k_r^\mu; \mu(j), (\sum(j) + k_r^\Sigma))} \qquad [\text{Equation 3}]$$

Here, $p_r(i)$ is a probability of reading, $N(x;m,V)$ is a normal distribution function having an average of m and a covariance of V, $\mu$ is an average of a stochastic memory, $\Sigma$ is a covariance of the stochastic memory, $k_r^\mu$ is a reading average key of parameters for reading, and $k_r^\Sigma$ is a reading covariance key of the parameters for reading.

Meanwhile, the reading statistic determiner 120 employed in an exemplary embodiment of the present invention uses an average of reading stochastic values, which is an expected value obtained by linearly combining the average key of the parameters for reading and the average of the stochastic memory 111 according to a ratio of a reciprocal of the covariance key of the parameters for reading to a reciprocal of the covariance of the stochastic memory 111, and a covariance of the reading stochastic values, which is an expected value of an harmonic average of the covariance key of the parameters for reading and the covariance of the stochastic memory 111, as shown in Equation 4 below.

$$r_\mu = \sum_{i=1}^{M} [\sum(i)^{-1} + (k_r^\Sigma)^{-1}]^{-1} [\sum(i)^{-1}\mu(i) + (k_r^\Sigma)^{-1}k_r^\mu] p_r(i) \qquad [\text{Equation 4}]$$

$$r_\Sigma = \sum_{i=1}^{M} [\sum(i)^{-1} + (k_r^\Sigma)^{-1}]^{-1} p_r(i)$$

Here, $r_\mu$ and $r_\Sigma$ are an average and a covariance of reading stochastic values, $\mu$ and $\Sigma$ are an average of a stochastic memory and a covariance of the stochastic memory, $k_r^\mu$ is a average key of parameters for reading, $k_r^\Sigma$ is a covariance key of the parameters for reading, and $p_r$ is a reading probability.

Figure 3:
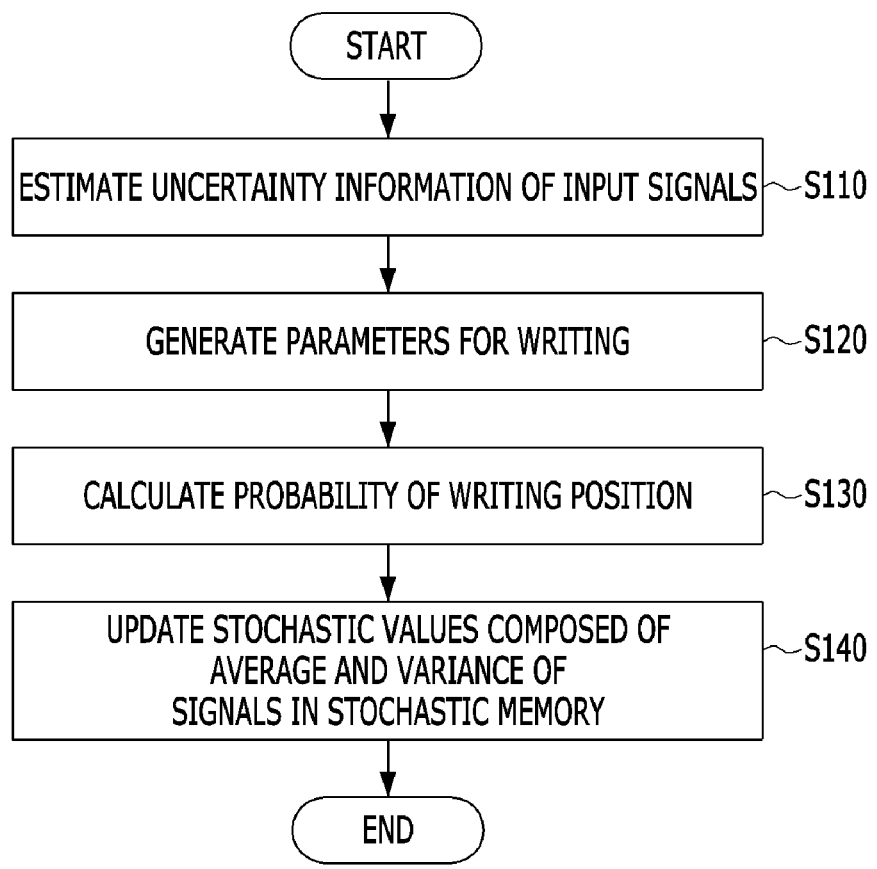
FIG. 3 is a flowchart illustrating a method of writing an input signal in a stochastic memory among methods for a statistical memory network according to an exemplary embodiment of the present invention.

A method of recording an input signal in the stochastic memory 111 among methods for a statistical memory network according to an exemplary embodiment of the present invention will be described below with reference to FIG. 3.

First, the uncertainty estimator 113 estimates uncertainty information of external input signals from the input signals and provides the uncertainty information of the input signals to the writing controller 115 (S110). In the uncertainty estimation operation (S110), a Kalman filter may be used. Here, the uncertainty information of the external input signals is an average and a variance of noise.

Thereafter, the writing controller 115 generates parameters for writing in the stochastic memory 111 using the external input signals and the uncertainty information and generates additional statistics by converting statistics of the external input signals (S120).

Subsequently, the writing probability calculator 117 calculates a probability of a writing position of the stochastic memory 111 using the parameters for writing (S130).

Thereafter, the statistic updater 119 updates stochastic values of signals stored at a position of the stochastic memory 111 corresponding to the probability of a writing position with additional stochastic values generated by converting an average and a covariance of the input signals (S140).

Figure 4:
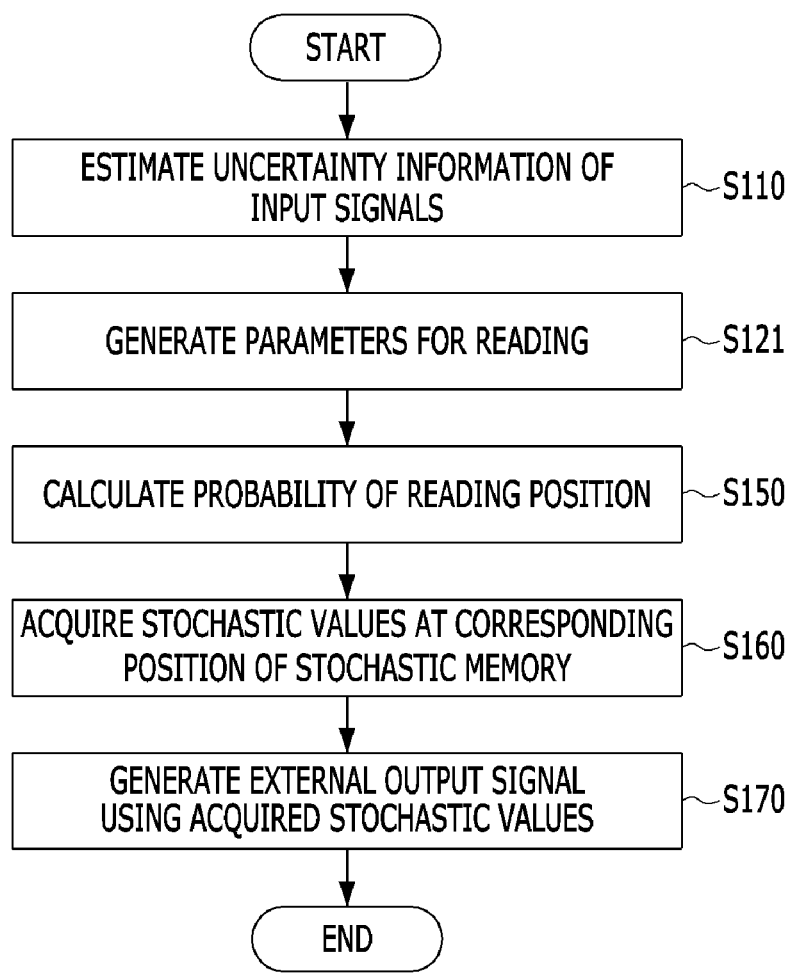
FIG. 4 is a flowchart illustrating a method of reading an input signal from a stochastic memory among methods for a statistical memory network according to an exemplary embodiment of the present invention.

A method of reading an input signal in the stochastic memory 111 among methods for a statistical memory network according to an exemplary embodiment of the present invention will be described below with reference to FIG. 4.

First, the uncertainty estimator 113 estimates uncertainty information of external input signals from the input signals and provides the uncertainty information of the input signals to the reading controller 116 (S110). In the uncertainty estimation operation (S110), a Kalman filter may be used. Here, the uncertainty information of the external input signals is an average and a variance of noise.

Thereafter, the reading controller 116 generates parameters for reading the stochastic memory 111 using the external input signals and the uncertainty information (S121).

The reading probability calculator 118 calculates a probability of a reading position of the stochastic memory 111 using the parameters for reading provided by the reading controller 116 (S150).

Thereafter, the reading statistic determiner 120 acquires stochastic values composed of an average and a variance of signals stored at a position of the stochastic memory 111 corresponding to the calculated probability of a reading position (S160).

Subsequently, the reading controller 116 generates an external output signal using the stochastic values acquired by the reading statistic determiner 120 (S170). In the operation (S170) of generating the external output signal, a neural network configured by stacking multiple layers of recurrent neural networks having an LSTM structure and then causing a linear transformation in a final layer may be used, but the operation (S170) is not limited to the neural network.

In the operation (S130) of calculating the probability of a writing position of the stochastic memory 111 according to an exemplary embodiment of the present invention, a ratio of a normal distribution probability at a position of the stochastic memory 111 is calculated as the probability of a writing position using the average and the covariance of the stochastic memory 111, and an average key and a covariance key of the parameters for writing as shown in Equation 1.

In the operation (S140) of updating the stochastic values of the stochastic memory 111, an existing average of the stochastic memory 111 is deleted at a ratio of the product of a deletion weight of the parameters for writing and a deletion constant of the parameters for writing as shown in Equation 2.

Then, an updated average of the stochastic memory 111 is acquired by adding the product of an average of the additional statistics and the probability of a writing position.

Thereafter, an existing variance of the stochastic memory 111 is deleted as much as a ratio of the product of the square of a difference between the deletion weight of the parameters for writing and the existing average of the stochastic memory 111 and the deletion constant of the parameters for writing.

Subsequently, an updated variance of the stochastic memory 111 is acquired by adding the product of the probability of a writing position and the sum of the square of a difference between the average of the additional statistics and the existing average of the stochastic memory 111 and a variance of the additional statistics.

In the operation (S150) of calculating the probability of a reading position, a ratio of a normal distribution probability at a position of the stochastic memory 111 is calculated as the probability of a reading position using the average and the covariance of the stochastic memory 111, and an average key and a covariance key of the parameters for reading as shown in Equation 3.

In the operation (S170) of generating the external output signal, an average of reading stochastic values, which is an expected value obtained by linearly combining the average key of the parameters for reading and the average of the stochastic memory 111 according to a ratio of a reciprocal of the covariance key of the parameters for reading to a reciprocal of the covariance of the stochastic memory 111, and a covariance of the reading stochastic values, which is an expected value of an harmonic average of the covariance key of the parameters for reading and the covariance of the stochastic memory 111, are used as shown in Equation 4.

According to an exemplary embodiment of the present invention, an apparatus for a memory network is capable of processing stochastic characteristics of signals. Therefore, it is possible to store and manage stochastic signals, such as speech and video signals contaminated with noise, in a stochastic memory.

Figure 5:
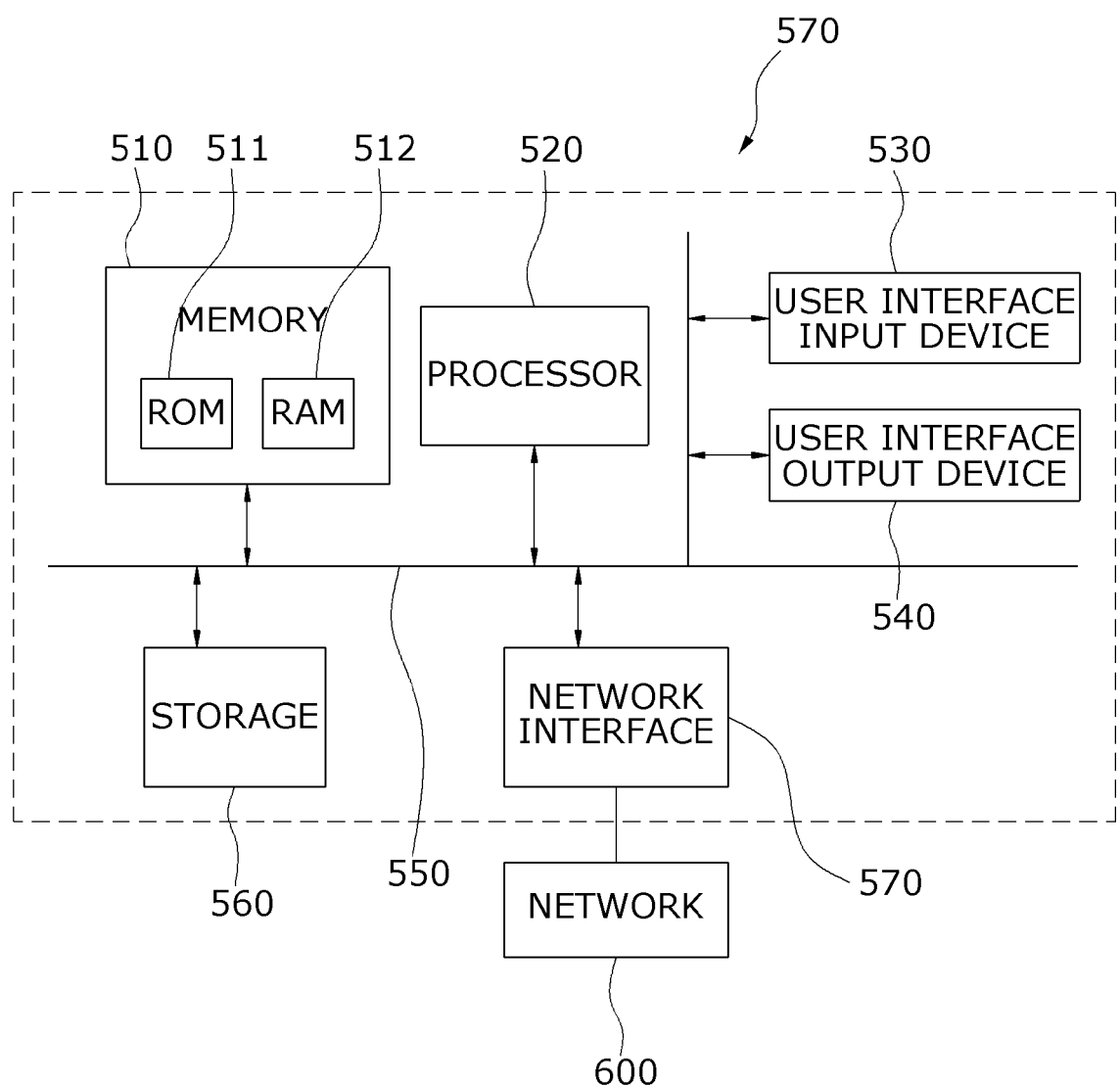
FIG. 5 is a block diagram illustrating a computer system to which the present invention is applied.

FIG. 5 is a block diagram illustrating a computer system to which the present invention is applied.

As shown in FIG. 5, a computer system 500 may include one or more of a memory 510, a processor 520, a user input device 530, a user output device 540, and a storage 560, each of which communicates through a bus 550. The computer system 500 may also include a network interface 570 that is coupled to a network 600. The processor 520 may be a central processing unit (CPU) or a semiconductor device that executes processing instruction stored in the memory 510 and/or the storage 560. The memory 510 and the storage 560 may include various forms of volatile or non-volatile storage media. For example, the memory 510 may include a read-only memory (ROM) 511 and a random access memory (RAM) 512.

Also, according to an exemplary embodiment of the present invention, it is possible to process and output stochastic signals, such as speech and video signals contaminated with noise, in a stochastic memory in which stochastic characteristics of signals are stored.

Although embodiments of the present invention have been described in detail above with reference to the accompanying drawings, the embodiments are mere examples, and various modifications and alterations can be made by those of ordinary skill in the technical field to which the present invention pertains without departing from the technical spirit of the present invention. Therefore, the scope of the present invention is not limited to the above-described embodiments and is only defined by the following claims.

What is claimed is:

1. An apparatus for a statistical memory network, the apparatus comprising:
   a stochastic memory;
   an uncertainty estimator configured to estimate uncertainty information of external input signals from the input signals and provide the uncertainty information of the input signals;
   a writing controller configured to generate parameters for writing in the stochastic memory using the external input signals and the uncertainty information and generate additional statistics by converting statistics of the external input signals;

a writing probability calculator configured to calculate a probability of a writing position of the stochastic memory using the parameters for writing; and a statistic updater configured to update stochastic values of signals stored at a position of the stochastic memory corresponding to the probability of a writing position with an average and a covariance of the additional statistics, wherein the writing probability calculator calculates a ratio of a normal distribution probability at a stochastic memory position as the probability of a writing position using an average and a covariance of the stochastic memory and an average key and a covariance key of the parameters for writing.

2. The apparatus of claim 1, further comprising:

a reading controller configured to generate parameters for reading the stochastic memory using the external input signals and the uncertainty information provided by the uncertainty estimator;

a reading probability calculator configured to calculate a probability of a reading position of the stochastic memory using the parameters for reading provided by the reading controller; and a reading statistic determiner configured to acquire stochastic values composed of an average and a variance of signals stored at a position of the stochastic memory corresponding to the calculated probability of a reading position, wherein the reading controller generates an external output signal using the stochastic values acquired by the reading statistic determiner.

3. The apparatus of claim 2, wherein the reading probability calculator calculates a ratio of a normal distribution probability at a stochastic memory position as the probability of a reading position using an average and a covariance of the stochastic memory and an average key and a covariance key of the parameters for reading.

4. The apparatus of claim 2, wherein the reading statistic determiner uses an average of reading stochastic values, which is an expected value obtained by linearly combining an average key of the parameters for reading and an average of the stochastic memory according to a ratio of a reciprocal of a covariance key of the parameters for reading to a reciprocal of a covariance of the stochastic memory, and a covariance of the reading stochastic values, which is an expected value of an harmonic average of the covariance key of the parameters for reading and the covariance of the stochastic memory.

5. The apparatus of claim 1, wherein the uncertainty estimator uses a Kalman filter.

6. The apparatus of claim 1, wherein the uncertainty information of the external input signals includes an average and a variance of noise.

7. The apparatus of claim 1, wherein the writing controller uses a neural network configured by stacking multiple layers of recurrent neural networks having a long short-term memory (LSTM) structure and then causing a linear transformation in a final layer.

8. The apparatus of claim 1, wherein the statistic updater acquires an updated average of the stochastic memory by deleting an existing average of the stochastic memory at a ratio of a product of a deletion weight of the parameters for writing and a deletion constant of the parameters for writing and adding a product of the average of the additional statistics and the probability of a writing position, deletes an existing variance of the stochastic memory as much as a ratio of a product of a square of a difference between the deletion weight of the parameters for writing and the existing average of the stochastic memory and the deletion constant of the parameters for writing, and acquires an updated variance of the stochastic memory by adding a product of the probability of a writing position and a sum of a square of a difference between the average of the additional statistics and the existing average of the stochastic memory and the variance of the additional statistics.

9. A method for a statistical memory network, the method comprising:

estimating, by an uncertainty estimator, uncertainty information of external input signals from the input signals and providing the uncertainty information of the input signals;

generating, by a writing controller, parameters for writing in a stochastic memory using the external input signals and the uncertainty information and generating additional statistics by converting statistics of the external input signals;

calculating, by a writing probability calculator, a probability of a writing position of the stochastic memory using the parameters for writing; and updating, by a statistic updater, stochastic values of signals stored at a position of the stochastic memory corresponding to the probability of a writing position with an average and a covariance of the additional statistics, wherein the calculating of the probability of a writing position of the stochastic memory comprises calculating a ratio of a normal distribution probability at a stochastic memory position as the probability of a writing position using an average and a covariance of the stochastic memory and an average key and a covariance key of the parameters for writing.

10. The method of claim 9, further comprising:

generating, by a reading controller, parameters for reading the stochastic memory using the external input signals and the uncertainty information provided by the uncertainty estimator;

calculating, by a reading probability calculator, a probability of a reading position of the stochastic memory using the parameters for reading provided by the reading controller;

acquiring, by a reading statistic determiner, stochastic values composed of an average and a variance of signals stored at a position of the stochastic memory corresponding to the calculated probability of a reading position; and generating, by the reading controller, an external output signal using the stochastic values acquired by the reading statistic determiner.

11. The method of claim 10, wherein the generating of the external output signal comprises using a neural network configured by stacking multiple layers of recurrent neural networks having a long short-term memory (LSTM) structure and then causing a linear transformation in a final layer.

12. The method of claim 10, wherein the calculating of the probability of the reading position of the stochastic memory comprises calculating a ratio of a normal distribution probability at a stochastic memory position as the probability of a reading position using an average and a covariance of the stochastic memory and an average key and a covariance key of the parameters for reading.

13. The method of claim 10, wherein the generating of the external output signal comprises using an average of reading stochastic values, which is an expected value obtained by linearly combining an average key of the parameters for reading and an average of the stochastic memory according to a ratio of a reciprocal of a covariance key of the parameters for reading to a reciprocal of a covariance of the stochastic memory, and a covariance of the reading stochastic values, which is an expected value of an harmonic average of the covariance key of the parameters for reading and the covariance of the stochastic memory.

14. The method of claim 9, wherein the estimating of the uncertainty information comprises using a Kalman filter.

15. The method of claim 9, wherein the uncertainty information of the external input signals includes an average and a variance of noise.

16. The method of claim 9, wherein the updating of the stochastic values comprises:

acquiring an updated average of the stochastic memory by deleting an existing average of the stochastic memory at a ratio of a product of a deletion weight of the parameters for writing and a deletion constant of the parameters for writing and adding a product of the average of the additional statistics and the probability of a writing position;

deleting an existing variance of the stochastic memory as much as a ratio of a product of a square of a difference between the deletion weight of the parameters for writing and the existing average of the stochastic memory and the deletion constant of the parameters for writing; and acquiring an updated variance of the stochastic memory by adding a product of the probability of a writing position and a sum of a square of a difference between the average of the additional statistics and the existing average of the stochastic memory and a variance of the additional statistics.

* * * * *